United States Patent [19]

Mukai

[11] Patent Number: 5,077,233
[45] Date of Patent: Dec. 31, 1991

[54] METHOD FOR RECRYSTALLIZING SPECIFIED PORTIONS OF A NON-CRYSTALLINE SEMICONDUCTOR MATERIAL TO FABRICATE A SEMICONDUCTOR DEVICE THEREIN

[75] Inventor: Ryoichi Mukai, Kawasaki, Japan

[73] Assignee: Fujitsu Limited, Kawasaki, Japan

[21] Appl. No.: 513,045

[22] Filed: Apr. 23, 1990

Related U.S. Application Data

[63] Continuation of Ser. No. 183,296, Apr. 11, 1988, abandoned, which is a continuation of Ser. No. 784,607, Oct. 4, 1985, abandoned.

[30] Foreign Application Priority Data

Oct. 9, 1984 [JP] Japan ................................ 59-211703
Jan. 17, 1985 [JP] Japan ................................ 60-006221

[51] Int. Cl.$^5$ ............................................ H01L 21/321
[52] U.S. Cl. ................................ 437/62; 437/83; 437/84; 437/173; 148/DIG. 90; 148/DIG. 91
[58] Field of Search ............... 437/84, 173, 83, 62; 148/DIG. 90, DIG. 91

[56] References Cited

U.S. PATENT DOCUMENTS

| 4,282,543 | 8/1981 | Ihara et al. | 357/23.7 |
| 4,351,856 | 9/1982 | Matsui et al. | 357/60 |
| 4,596,604 | 6/1986 | Akiyama et al. | 357/23.1 |
| 4,661,167 | 4/1987 | Kusunoki et al. | 437/173 |
| 4,686,553 | 8/1987 | Possir | 357/23.7 |

FOREIGN PATENT DOCUMENTS

| 0047140 | 3/1982 | European Pat. Off. | |
| 3535528 | 5/1984 | France | 357/23.7 |
| 55-48926 | 4/1980 | Japan | 437/173 |
| 56-115558 | 9/1981 | Japan | 357/23.7 |
| 57-7926 | 1/1982 | Japan | 437/84 |
| 57-99778 | 6/1982 | Japan | 357/23.7 |
| 58-2073 | 1/1983 | Japan | 357/23.7 |
| 58-14524 | 1/1983 | Japan | |
| 58-115851 | 7/1983 | Japan | 357/23.7 |
| 59-228763 | 12/1984 | Japan | 357/23.7 |

OTHER PUBLICATIONS

Colinge et al., "Transistors Made in Single-Crystal SOI Films", IEEE Elect. Dev. Lett., V. EDL-4, No. 4 (Apr. 1983), pp. 75-77.
Ghandhi, *VLSI Fabrication Principles*, John Wiley and Sons, New York, NY (1983), pp. 423-424.
Patent Abstracts of Japan, vol. 7, No. 88 (E-170)[1233], Apr. 12, 1983; and JP-A-58 14 524 (Fujitsu K.K.) 01-2-7-1983.

(List continued on next page.)

*Primary Examiner*—Olik Chaudhuri
*Assistant Examiner*—Ourmazd Ojan
*Attorney, Agent, or Firm*—Staas & Halsey

[57] ABSTRACT

A random layout of devices, or at least active regions of devices, is achieved in fabricating semiconductor integrated circuits based on SOI technology using an anti-reflecting film. Windows are opened in the anti-reflecting film at positions corresponding to preselected regions of the semiconductor layer in which corresponding devices are to be formed, thereby to expose at least the surface area of each preselected region corresponding to the active region of the device to be formed therein. For each window, an energy beam substantially uniformly irradiates the exposed surface area including a portion of the anti-reflecting film bordering the window, sufficiently to heat the semiconductor layer and recrystallize the region thereof corresponding to the exposed surface area to a single crystalline form, free of grain boundaries. Self-aligned single crystal regions thus are fabricated in the polycrystalline silicon layer at the respective predetermined device regions. The channel region of an individual IG-FET is formed in each such single crystal region, and source and drain regions are formed within the preselected region, which may include adjacent polysilicon portions, contiguous with and separated by the single crystal region.

2 Claims, 6 Drawing Sheets

OTHER PUBLICATIONS

Journal of Applied Physics, vol. 55, No. 6, part 1, Mar. 15, 1984, pp. 1607–1609, American Institute of Physics, New York, U.S.; S. Kawamura et al.: "Laser Recrystallization of Si over SiO2 with a Heat-Sink structure".

IEEE Electron Device Letters, vol. EDL-4, No. 10, Oct. 1983, pp. 366–368, IEEE, New York, U.S.; S. Kawamura et al: "Three-dimensional CMOS IC's fabricated by using beam recrystallization".

Electronics Letters, vol. 19, No. 1, Jan. 6, 1983, pp. 12–14, London, GB; D. Herbst et al.: "PMOS Tranistors Fabricated in Large-Area Laser-Crystallised Si on Silica".

Applied Physics Letters, vol. 41, No. 4, Aug. 15, 1982, pp. 346–347, American Institute of Physics, New York, U.S.; JP. Colinge et al.: "Use of Selective Annealing for Growing Very Large Grain Silicon on Insulator Films".

Electronics International, vol. 55, No. 9, May 5, 1982, pp. 74–76, New York, U.S.; R. T. Gallagher: "Selective Laser Annealing Opens the Door to Stacked-transistor C-MOS Technology".

METHOD FOR RECRYSTALLIZING SPECIFIED PORTIONS OF A NON-CRYSTALLINE SEMICONDUCTOR MATERIAL TO FABRICATE A SEMICONDUCTOR DEVICE THEREIN

BACKGROUND OF THE INVENTION

1. Field of the Invention

The present invention relates to semiconductor integrated devices and circuits and methods of fabrication of same employing so-called SOI (semiconductor on insulator) technology, and, more particularly, to semiconductor integrated circuits and devices and to methods of fabrication thereof employing SOI technology and using an anti-reflecting film during laser beam irradiation for controlled recrystallization of the semiconductor layer.

2. State of the Prior Art

SOI technology is currently receiving increasing attention and interest due to the many attractive features which it affords, including providing semiconductor integrated circuits (IC's) with increased breakdown voltages between isolated, individual circuit components such as transistors and the like, and with reduced levels of parasitic capacitances between the circuit components and the substrate on which the circuit components are formed, affording improved operating speeds. A particularly significant feature of SOI technology is the capability afforded thereby of providing three-dimensional IC's, a structural configuration of semiconductors offering a promising technological breakthrough with regard to the limitation on integration density imposed by conventional IC technology.

In the initial, or early, stages of the evolution of SOI technology, efforts of researchers were directed to obtaining a recrystallized region which was as large as possible, in a polycrystalline semiconductor layer such as a polysilicon layer. These efforts, however, were confronted with the difficulty of forming a region at a desired, given position in the semiconductor layer which was free of grain boundaries. Where a grain boundary exists in the recrystallized region in which the active region of a transistor is formed, for example, the transistor characteristics are not comparable to those of ordinary transistors fabricated on a single crystal silicon substrate. For example, grain boundaries produce deleterious characteristics, such as increased leakage currents and nonuniformity of the threshold voltages of the transistors so affected.

More recent developments in the area of SOI technology appear to have focused on techniques for selective recrystallization of an amorphous or polycrystalline semiconductor layer. Specifically, only predetermined regions of the semiconductor layer, in each of which an active component such as a transistor is to be formed, are recrystallized into single crystal ions. Anti-reflecting film coatings, originally proposed for increasing efficiency of light beam irradiation as employed for recrystallizing a semiconducting layer, have been reported to be advantageous in performing such selective recrystallization, where the anti-reflecting film is modified into a stripe structure or pattern on the semiconductor layer to be irradiated. (See, Colinge et al., *Applied Physics Letters*, Vol. 41, p. 346, 1982.) In accordance with this known method, stripes of anti-reflecting film are formed in a transverse arrangement or pattern on an amorphous or polycrystalline layer. A laser beam is scanned along a center line between the stripes, the beam having a diameter of sufficient dimensions to cover at least two adjacent stripes. The level of the laser beam energy is controlled to be slightly above the lowest level necessary for melting the uncoated region of the silicon layer. Due to the higher level of absorption of the irradiating beam energy by the stripes of anti-reflecting film, as compared to the exposed regions of the silicon layer, a desired concave temperature profile in the lateral direction is achieved. This known method is described in further detail in the following, with reference to FIGS. 1(a) and 1(b).

FIGS. 1(a) and 1(b) comprise plan and elevational cross-sectional views, respectively, the latter taken along line B—B in FIG. 1(a), of a semiconductor layer on which anti-reflecting film stripes are formed and the resultant irradiation patterns afforded thereby, FIG. 1(c) comprising a plot of the concave temperature profile taken in the lateral direction relative to the stripes, namely, along the line B—B in FIG. 1(a).

More specifically, FIGS. 1(a) and 1(b) illustrate an amorphous or polycrystalline silicon layer 22, which is to be recrystallized into a single crystal silicon layer, and which is deposited on an amorphous insulating layer 21. An anti-reflecting film 23 of silicon nitride, $Si_3N_4$, is formed on the silicon layer 22 and delineated into the parallel stripes 23. By proper control of the thickness of the anti-reflecting film stripes 23, the reflectivity of the surface of the silicon layer 22 in the regions coated with the stripes 23 is approximately 5%, by comparison to a reflectivity of 60% in the uncoated, or exposed regions. When irradiated by a suitable energy beam, such as an argon ion laser beam, having a spot diameter larger than the distance between stripes 23, a temperature distribution profile as illustrated schematically in FIG. 1(c) is obtained in the lateral direction, i.e., along the line B—B in FIG. 1(a). Thus, in FIG. 1(c), the temperature T is plotted along the ordinate and the lateral distance between two adjacent stripes 23 is plotted on the abscissa; the temperature T is seen to have a concave profile in the lateral direction, having its lowest value at the midpoint or center position between the adjacent stripes 23.

As illustrated in FIG. 1(a), as the laser beam is scanned in the direction of the arrow along the center line between the stripes 23, recrystallization front edges are formed in the silicon layer 22, having a profile or configuration schematically indicated by the two curves 25' and 25", respectively representing two successive, time-displaced positions of the front edges corresponding to displaced positions of the scanning beam as it moves along the center line between the stripes 23 in 15 the direction of the arrow, as before noted. Each curve 25' and 25" indicates a solid-liquid interface and melting point distribution in the surface of the silicon layer 22. Because of the convex curvature of the successive curves 25' 25", . . . in the scanning direction, i.e., the central portion of each curve 25' and 25" comprises the leading edge thereof and the portions displaced from the center and approaching the respective stripes 23 trail progressively further therebehind, the dominant characteristic is the growth of a crystal grain nucleated from a virtual seed on the center line, which gradually spreads over the region between the stripes 23. As a result, grain boundaries between the dominant grain thus established and other subdominant grains are swept from the region between the stripes 23 and accumulate in the portion of the layer 22 underlying the stripes 23.

A similar concave temperature profile is reported to have been achieved using a doughnut-shaped laser beam for irradiating a polysilicon layer on an amorphous layer, affording successful recrystallization (See, Kawamura et al., *Applied Physics Letters,* Vol. 40, p. 394, 1982).

As reported in the literature, the use of anti-reflecting film stripes permits the formation of a single crystallized region of 20×100 square microns in a silicon layer on an amorphous insulating layer. The striped structure or pattern of the anti-reflecting film thus achieves efficiency in the use of the laser beam and permits the beam to be of a simple, or noncomplex, cross-sectional shape, e.g., a round, cross-sectional beam may be employed.

Methods employing such stripe patterns of anti-reflecting films, however, reduce the freedom of design of the device pattern layout on the semiconductor layer. With reference to FIG. 1(a), if devices or at least the active regions of devices, such as transistors, are located respectively in the regions 26a and 26b of the semiconductor layer 22, the device in the region 26a is formed in a single-crystallized region but a device in the region 26b is formed in a region in which grain boundaries may exist, for the reasons described before. Due to the deleterious and undesirable effects of grain boundaries on a device formed therein, a device in the region 26b is not acceptable; in other words, the device pattern layout must be restricted to the region between the anti-reflecting film stripes 23. As a result, the desired characteristic of the semiconductor layer with respect to permitting a random layout or arrangement therein of devices, or at least of the active regions of devices, is substantially inhibited; instead, the devices or at least the active regions thereof must be positioned in a relatively ordered arrangement, confined to the region between the stripes 23. Thus, whereas SOI technology using anti-reflecting film stripes is suitable for the fabrication of integrated circuits having well ordered, or defined, geometric patterns such as those based on gate array methodology, it is not suitable for IC's requiring a random arrangement of the devices such as logic IC's. The anti-reflecting stripe technique or methodology thus restricts the efficient use of the total area of the semiconductor in fabricating IC's, based on SOI technology.

SUMMARY OF THE INVENTION

Accordingly, it is an object of the present invention to provide a semiconductor integrated circuit based on SOI technology and using an anti-reflecting film, but wherein the layout of devices on the semiconductor layer may be substantially random.

Another object of the present invention is to provide a semiconductor integrated circuit based on SOI technology and using an anti-reflecting film, affording more effective use of the semiconductor area.

Yet another object of the present invention is to provide an insulated-gate transistor, based on SOI technology and employing an anti-reflecting film methodology, achieving improved fabrication yields.

These and other objects and advantages of the present invention are achieved in accordance with the method and resulting structure as disclosed herein, which provide for fabricating a semiconductor integrated circuit, based on SOI technology and using an anti-reflecting film, but wherein the anti-reflecting film is not in the form of stripes. More particularly, the fabrication method of the present invention comprises the steps of: (a) forming an amorphous or polycrystalline semiconductor layer on an amorphous insulating layer; (b) forming a film on the semiconductor layer which is anti-reflecting with respect to an irradiating light beam; (c) selectively forming windows, i.e., openings of defined dimensions, at predetermined positions in the anti-reflecting film corresponding to predetermined areas of the underlying substrate selected as device regions, thereby to expose those areas; (d) irradiating a selected area of the surface of the anti-reflecting film, including at least one of the windows, with a light beam of sufficient energy level to satisfy the condition that the semiconductor layer is recrystallized to single crystalline form, free of grain boundaries; and (e) forming a semiconductor device, or at least the active region of such a device, in at least one of the predetermined, single crystalline areas of the semiconductor layer.

These and other objects and advantages of the fabrication method and resulting semiconductor devices and integrated circuits made thereby in accordance with the invention will become more apparent from the following detailed description and drawings thereof.

DETAILED DESCRIPTION OF THE PREFERRED EMBODIMENTS

Figure 2A:
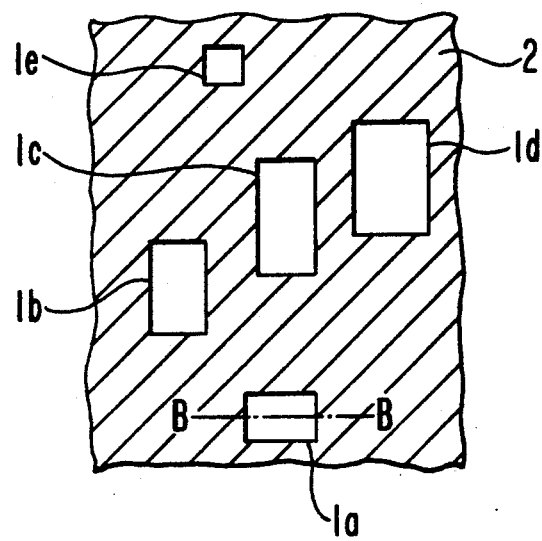
FIGS. 2(a) and 2(b) are schematic, plan and cross-sectional elevational views, respectively, the latter taken along the line B—B in FIG. 2(a), illustrating a fabrication method in accordance with a first embodiment of the present invention.
Figure 2B:
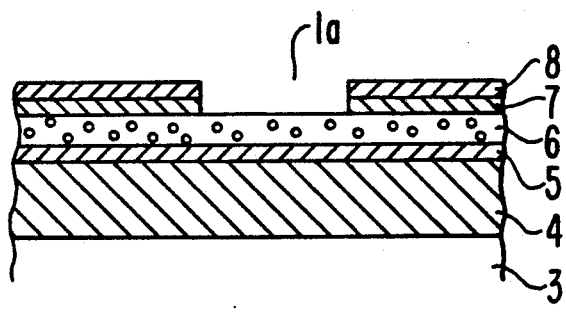

A first embodiment of the present invention is disclosed herein with reference to the schematic, plan view of FIG. 2(a) and the cross-sectional, elevational view of FIG. 2(b), the latter taken along line B—B in FIG. 2 and to which concurrent reference is now had. A silicon wafer 3 is subjected to a thermal oxidation process, for example, for forming an insulating layer 4 of $SiO_2$ in a thickness of about 1 micron on the surface thereof, and which serves as a substrate. A silicon nitride layer 5 in a thickness of 1,000 Å and a polysilicon layer 6 in a thickness of 4,000 Å are formed on the $SiO_2$ layer 4, by a low pressure chemical vapor deposition (LPCVD) method, for example. The polysilicon layer 6 is the layer which is subjected to recrystallization in a later stage of the process; the silicon nitride layer 5, on the other hand, is provided to improve adhesion of the polysilicon layer 6, after the recrystallization step is performed, to the underlying substrate comprising the $SiO_2$ layer 4. A second layer 7 of silicon dioxide ($SiO_2$) in a thickness of about 300 Å then is formed by thermally oxidizing the surface of the polysilicon layer 6; thereafter, a silicon nitride layer 8 of about 300 Å thickness is deposited on the $SiO_2$ layer 7 by an LPCVD method, for example.

The $SiO_2$ layer 7 and the silicon nitride layer 8 comprise a dual laminate, or layer, which functions as an anti-reflecting film 2, as designated in FIG. 2(a). The thickness of the composite anti-reflecting film 2 accordingly is the combined thickness of layers 7 and 8 and is determined in accordance with the wavelength of the irradiating laser beam employed for recrystallization and the index of refraction of the materials of the laminated layers with respect to that wavelength. Whereas the dual layer laminate structure of the anti-reflecting film 2 affords certain advantages, later described, the anti-reflecting film 2 in the alternative may comprise a single layer of either $SiO_2$ or silicon nitride.

Figure 1A:
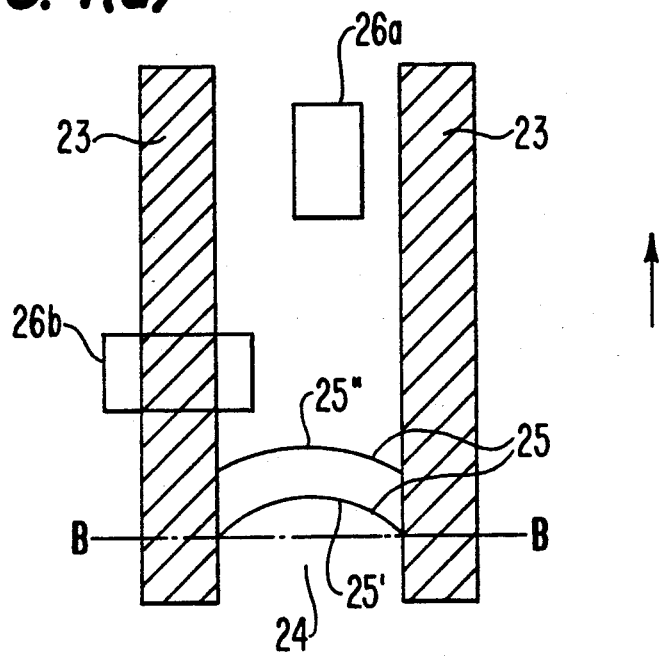
FIGS. 1(a) and 1(b) are schematic, plan and elevational cross-sectional views, respectively, the latter taken along the line B—B in FIG. 1(a), of an amorphous or polycrystalline silicon layer formed on an amorphous insulating layer and having stripes of anti-reflecting material formed thereon, as employed in a known SOI methodology.
Figure 1B:
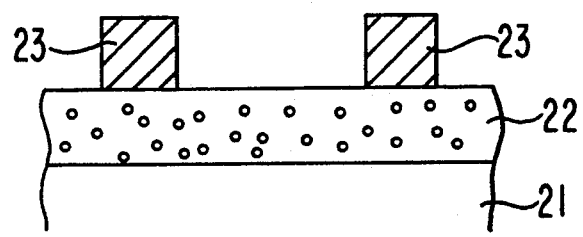

As best seen in FIG. 2(a), a plurality of substantially rectangular-shaped openings, or windows, 1a, 1b, . . . is formed in the anti-reflecting film 2, at positions corresponding to predetermined areas of the underlying substrate selected as device regions (i.e., regions in which devices such as transistors, or at least the active regions of devices such as the channel regions of transistors, are to be formed. The typical width and length dimensions of each opening are in the range of from 10 to 20 microns, for example. The significance of providing openings, or windows, through which the underlying, predetermined areas of the substrate are exposed, affords significant benefits in contrast to the exposure of the underlying substrate between the anti-reflecting stripes 23 of the prior art structures of FIGS. 1(a) and 1(b), as will be explained.

A light beam from a cw (continuous wave) Ar ion laser, for example, having an output power of 8 to 14 watts, is scanned at a speed of 5 cm/sec. over the anti-reflecting film 2 and the predetermined areas of the polysilicon layer 6 which are exposed through the windows 1a, 1b, . . . . The scanning may be performed by translating the wafer 3 relative to a fixed beam or, alternatively, by maintaining the wafer 3 stationary and scanning the beam thereover, in either case controlling the scanning pitch to be smaller than the diameter, "D," of the beam so that the traces of the successive beam scans overlap. A preferable overlap ratio is approximately 70% of the beam diameter, D. A suitable beam diameter, D, is 80 to 100 microns as measured by the width of the region irradiated by the beam on the substrate. As before noted, the dimensions of the windows 1a, 1b, . . . are from 10 to 20 microns; since the beam is relatively larger than the individual windows by a factor of from 4 to 10 times, and since the scanning speed is relatively high compared to the dimension of each opening in the direction of scan, the area of the polysilicon layer which is exposed at each window effectively is heated by a pulse of a fixed beam.

Whereas a laser beam has been suggested as an example of the irradiation source to perform recrystallization, the invention is not so limited; instead, other energy beams having sufficient energy density may be employed in the alternative, such as a focused emission mercury lamp beam.

Figure 1C:
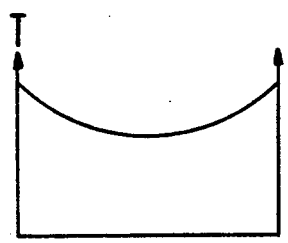
FIG. 1(c) is a temperature distribution profile taken in a lateral direction relative to the stripes of FIGS. 1(a) and 1(b), and particularly along the line B—B in FIG. 1(a), resulting from irradiation of the structure thereof, the abscissa representing the spacing in the lateral direction between the anti-reflecting stripes in the structure of FIG. 1(a) and the ordinate representing a plot of the temperature of the substrate resulting from irradiation.
Figure 3A:
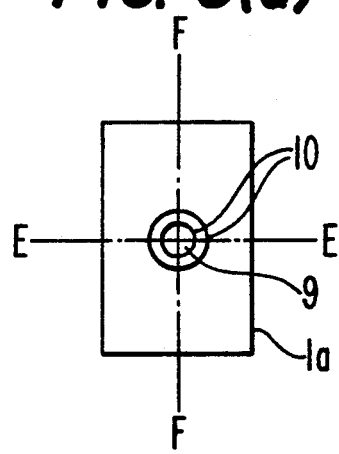
FIG. 3(a) is a schematic, plan view illustrating the growth of a single recrystallized region in a window in an anti-reflecting film as illustrated in FIGS. 2(a) and 2(b), in accordance with the first embodiment of the present invention.
Figure 3C:
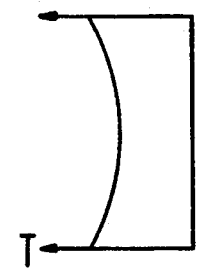
FIGS. 3(b) and 3(c) comprise temperature distribution profiles taken along the lines E—E and F—F, respectively, during an irradiation process with respect to the window in the anti-reflecting film in the structure of FIG. 3(a)
Figure 3B:
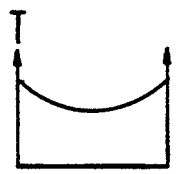

FIG. 3(a) is a plan view schematically illustrating the growth of a single recrystallized region in the selected area of the substrate exposed through a specific window, for example the window 1a, in the structure of FIG. 2(a). FIGS. 3(b) and 3(c) are temperature distribution profiles taken along the lines E—E and F—F, respectively, in FIG. 3(a); in each instance, the coordinate labelled T corresponds to temperature measurements and the coordinate values plotted with respect to the axis perpendicular to the temperature axis correspond to positions across the window, taken along the respective lines E—E and F—F. As in the temperature profile plotted with respect to the stripe structures of the anti-reflecting film shown in FIG. 1(c) with reference to the structures of FIGS. 1(a) and 1(b), in FIG. 3(b), the temperature T is lowest at the center of the window 1a in the lateral direction defined by line E—E in FIG. 3(a) (i.e., assuming a line of scan in the direction of line F—F in FIG. 3(a), and increases toward the periphery of the opening 1a because of the greater absorption of the energy of the irradiating laser beam into the portions of the substrate 6 underlying the anti-reflecting film 2. Moreover, the profile of the temperature T, taken along the line F—F in FIG. 3(a) and as correspondingly plotted in FIG. 3(c), as well has the characteristic that it is lowest at the center of the window 1a, even where the direction of scan is in that same direction and centered on the line F—F. As before noted, in view of the dimensions of the window and the relatively high scanning speed, the exposed area of the polysilicon layer within the window 1a effectively is heated by a pulse of a fixed beam, producing effectively simultaneous and thus uniform heating of the entire area of the substrate exposed within the window 1a. In general, this condition is satisfied when the dimensions of the opening, taking into account the relatively high scanning speed of the energy beam, are such that the entirety of the area of the substrate exposed through the window 1(a) remains in a molten state after the beam has advanced beyond the exposed area, i.e., is no longer radiating any portion of the exposed area.

As a result, immediately following cessation of irradiation by the effective pulse of laser beam energy, recrystallization of the area of the polysilicon layer exposed through the window 1a initiates from a nucleus 9 at the center of the opening 1a. A substantially isotropic recrystallization then proceeds to spread radially outwardly in a uniform manner, as indicated by the successive, larger radius circles 10 in FIG. 3(a) representing successive points in time, such that the recrystallization eventually fills in the entirety of the window 1a. Thus, a single crystalline polysilicon layer free of grain boundaries is formed in the area exposed through the window 1a and similiarly in other areas exposed through corresponding, other windows 1b, 1c, . . . in the anti-reflecting film 2 as illustrated in FIG. 2a.

FIGS. 4(a) to 4(g) comprises elevational cross-sectional views of a semiconductor device at successive steps or stages in the fabrication thereof in accordance with a second embodiment of the present invention, again based on SOI technology.

Figure 4A:
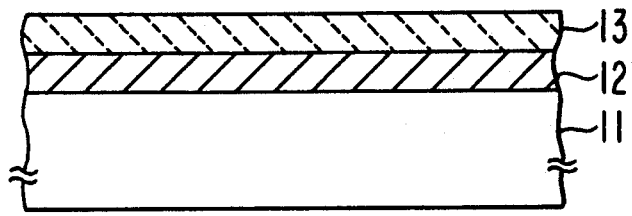
FIGS. 4(a) to 4(g) comprise schematic, cross-sectional elevational views of a semiconductor device based on SOI technology and fabricated in accordance with a second embodiment of the method of the present invention, taken at successive stages of the fabrication process.

With reference to FIG. 4(a), a silicon substrate 11 is subjected to a thermal oxidation process, for example, to form an $SiO_2$ insulating layer 12 having a thickness of about 1 micron. An amorphous or polycrystalline silicon layer 13 having a thickness of about 4,000 Å then is deposited on the insulating layer 12 using a CVD (chemical vapor deposition) method. In the following description of this embodiment, it will be assumed that the silicon layer 13 comprises a polysilicon layer. The polysilicon layer 13 then is doped with a predetermined concentration of boron, B, as a p-type impurity, by an ion implantation technique so that the polysilicon layer 13 has a p-type conductivity.

Figure 4B:
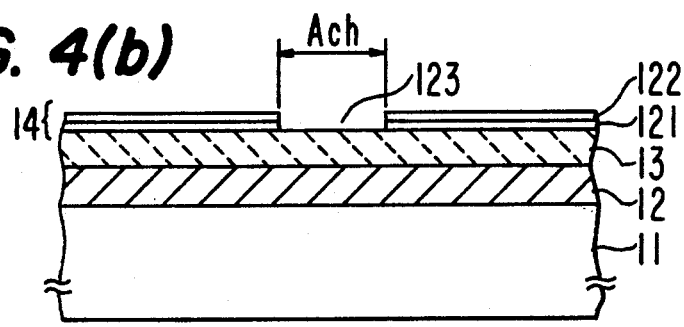

With reference to FIG. 4(b), an $SiO_2$ thin film 121 having thickness of about 300 Å then is formed on the polysilicon layer 13 using, for example, a thermal oxidation process. Thereafter, a silicon nitride ($Si_3N_4$) film 122 having a thickness of about 300 Å is deposited on the $SiO_2$ film 121 by a CVD method. Portions of the $SiO_2$ film 121 and the $Si_3N_4$ film 122 then are selectively removed, such as by a conventional photolithographic technique, to form windows at aligned positions through the films 121 and 122, as illustrated by the window 123, thereby correspondingly to expose the underlying polysilicon layer 13, as illustrated by the region Ach. While only a single window 123 is illustrated in FIG. 4(b), it is to be understood that a plurality of such windows and corresponding exposed regions Ach would be formed simultaneously, in a practical application of the process.

The combination of the $SiO_2$ film 121 and the $Si_3N_4$ film 122 comprises a dual laminate, or dual layer, anti-reflecting film 14 with respect to subsequent laser beam irradiation which is to be performed. As before noted, the anti-reflecting film 14 may comprise in the alternative only a single one of either of the $SiO_2$ film 121 or the $Si_3N_4$ film 122; however, the use of the dual laminate or double-layered anti-reflecting film 14 as shown in FIG. 4(b) offers the advantage of employing the large difference between the etching rates of $SiO_2$ and $Si_3N_4$, or silicon, when subjected to etchants such as carbon tetra-fluoride ($CF_4$) gas and a hydrochloric acid (HF) solution. For example, during a dry etching process for forming the window 123, the $SiO_2$ film 121 has a relatively low etching rate, compared with the rates of the $Si_3N_4$ film 122 and the polysilicon layer 13, and thus functions as an etch-stop layer with respect to the etching process performed by an etching gas such as $CF_4$, but thereafter may be removed easily by an HF solution without affecting the polysilicon layer 13. This selective etch control capability afforded by the dual laminate anti-reflecting film facilitates the precise formation of the openings 123 in the anti-reflecting film 14.

Figure 4C:
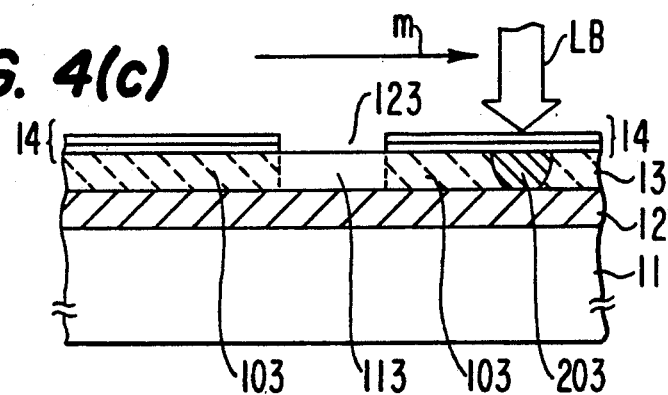

The substrate 11 then is heated at about 450° C. in atmospheric air and, as shown in FIG. 4(c), a laser beam LB which may be an Ar ion laser, for example, is scanned across the surface of the substrate in the direction of the arrow "m" so as to irradiate the anti-reflecting film 14 and to encompass the opening 123 therein during the scanned path. Thus, the irradiated portion of the polysilicon layer 13 is heated to a molten state by the scanning beam, recrystallizing the portion 113 underlying the opening 123 into a single crystal; conversely, the portions 103 underlying the anti-reflecting film 14 represent domains which are recrystallized into a polycrystalline state, the portion 203 directly underlying the current position of the beam LB as shown in FIG. 4(c) being in a molten state.

The intensity and speed of scan of the laser beam LB are controlled in accordance with the differing reflectivity characteristic of the anti-reflecting film 14 versus that of the exposed surface of the polysilicon layer 13 at the opening 123 and the corresponding differing energy absorption afforded thereby, to achieve the desired heating and corresponding melting conditions within the polysilicon layer 13. Specifically, the surface reflectivity of the anti-reflecting film 14 is approximately 5% whereas the surface reflectivity of the exposed polysilicon layer at the opening 123 is approximately 60%. Thus, the intensity and scanning speed of the laser beam LB are selected with reference to these differing surface reflectivity characteristics such that the energy level of the beam is insufficient for raising the region of polysilicon layer 13 exposed at the opening 123 to its melting point in the absence of the surrounding anti-reflecting film 14. The greater heat absorption which occurs in the portions of the polysilicon layer 13 underlying the anti-reflective coating 14 thus is required under this condition for melting of the region of the polysilicon layer 13 which is exposed through the window 123. Exemplary conditions complying with this requirement are as follows:

Laser output: 10 Watts
Laser beam diameter (D): 50 microns
Scanning speed: 5 cm/sec.

In the above, the laser beam diameter (D) is defined with respect to the width of the melted region of the polysilicon layer underlying an anti-reflecting film 14 in accordance with FIG. 4(c), when the 1a ser beam LB is scanned thereover.

When scanned with a laser beam under the above condition, recrystallization of the polysilicon layer 13 initiates at the center of the window 123 and spreads uniformly and generally radially outwardly therefrom, as explained with reference to FIG. 3(a). Thus, the region Ach of the polysilicon layer 13 exposed at the window 123 is recrystallized as a single crystal silicon layer; however, recrystallization into a single crystal layer does not occur in the portion of the polysilicon layer 13 bordering the edges of the window 123 and thus lying under the anti-reflecting film 14, as before noted.

In accordance with the present invention, therefore, a number of openings are formed in the anti-reflecting film which are positioned randomly, or at will, at positions corresponding to predetermined regions of the polysilicon layer in which respective devices, or at least the active regions of devices, are to be formed. Because of the random positioning of the windows, it is probable that regions of the polysilicon layer which were previously recrystallized to single crystalline form in a prior scan of the laser beam inadvertently may be scanned again, due to the overlapping scan pattern. Such an occurrence does not result in further melting of the single crystalline region, however, because the heat necessary to melt the exposed, single crystalline region, is not available. Specifically, due to the displacement of the laser beam in performing a successive scan in the overlap scan pattern, the anti-reflecting film 14 bordering the far side of the window 123 would not be radiated a second time.

Figure 4D:
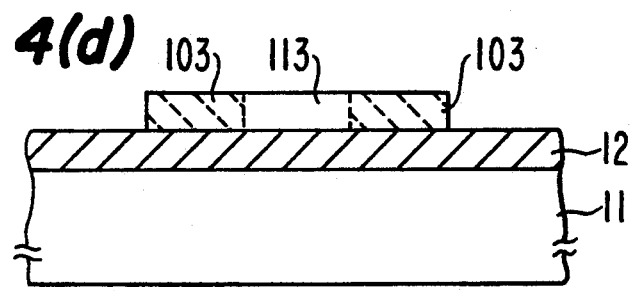

After the regions of the polysilicon layer 13 exposed through the corresponding windows 123 have been recrystallized to a single crystalline form and thus are free of grain boundaries (whereas, by contrast, the portions of the polycrystalline layer 13 bordering the periphery of the window 123 and underlying the film 14 are recrystallized as a polycrystalline layer), the $Si_3N_4$ film 122 and the $SiO_2$ film 121, comprising the anti-reflecting film 14, are removed, respectively, by a hot phosphoric acid solution and a hydrafluoric acid solution. The polysilicon layer 13 then is formed into islands, each island comprising a corresponding single-crystalline region 113 and associated polycrystalline peripheral regions 103, as shown in FIG. 4(d).

Figure 4E:
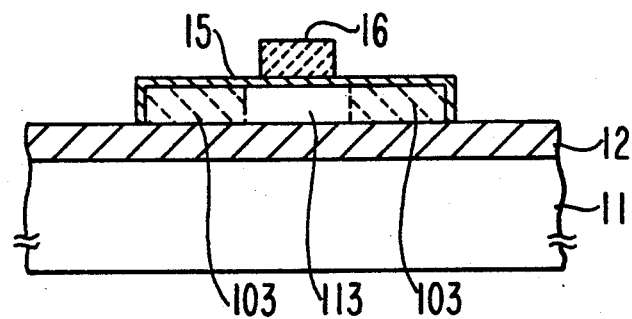

The surface of the island then is subjected to thermal oxidation, producing a gate oxide layer 15 of a predetermined thickness, as seen in FIG. 4(e). Subsequently, a polysilicon layer having a thickness of about 4,000 Å is formed on the island by a conventional CVD process and then is selectively etched, such as by a conventional photolithographic technique, to form a gate electrode 16 on the single-crystalline region 113.

Figure 4F:
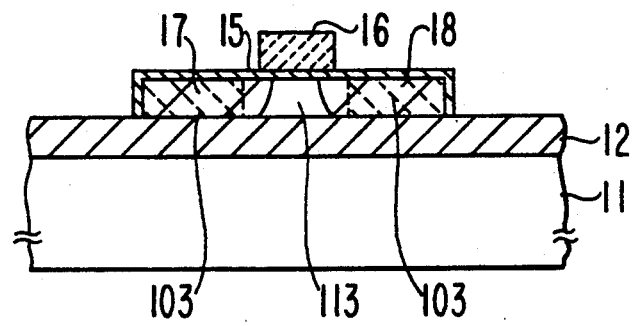

Following formation of the gate electrode 16, the polysilicon layer regions 103 are ion implanted with a high concentration of an impurity, such as arsenic (As), using the polysilicon gate electrode 16 as a mask, followed by annealing at a temperature of 1,050° C., thereby to form n+-type source and drain regions 17 and 18, as illustrated in FIG. 4(f). Thus, the basic structure of an insulated-gate field effect transistor (IG-FET), or a MOS transistor, is completed, based on the SOI technology.

Figure 4G:
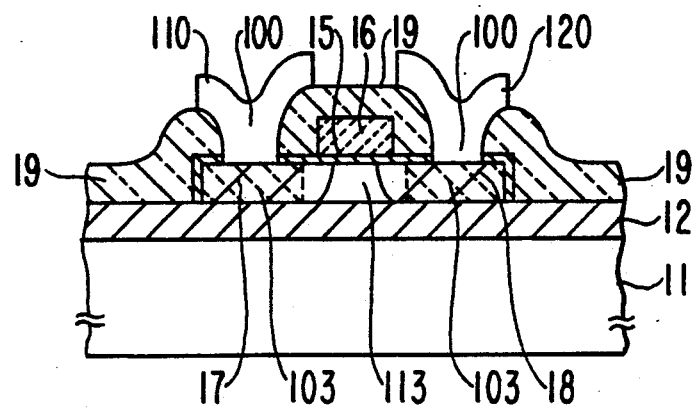

An insulating coating or protective layer 19 then is formed on the entire surface of the transistor structure, in a thickness of about 8,000 Å Contact holes 100 are formed in the layer 19 through which respective wiring layers 110 and 120 of aluminum, for example, are formed to provide connections to the source and drain regions 17 and 18, respectively, as shown in FIG. 4(g). If the insulating layer 19 comprises a phospho-silicate glass (PSG) material, a heating process (conventionally referred to as a reflow process) is performed at a temperature of approximately 1,050° C., for example, to blunt, or smooth, the sharp edges which typically form around the contact holes 100.

In the foregoing process, heating at a temperature of as high as 1,050° C. typically is necessary for annealing the ion-implanted source and drain regions 17 and 18 as well as in the reflow process performed with respect to the contact holes 100 in the PSG layer 19. The heating processes, since performed at such a high temperature, tend to cause diffusion of the doped impurities from the source and drain regions 17 and 18 into the single crystal region 113. If a grain boundary were to exist in the single crystal region 113, the impurity diffusion along the grain boundary would be accelerated; as a result, there would occur in the devices formed in the recrystallized semiconductor layer such defects as increased leakage currents, nonuniform threshold voltages and the like, comprising problems in the prior art. The provision of single crystalline areas free of grain boundaries, in accordance with the invention, thus avoids these prior art problems, as well.

The method of the present invention thus affords significant advantages in the fabrication of semiconductor integrated circuits based on SOI technology. As before noted, in the prior art methods using anti-reflecting films, it is substantially impossible to achieve a semiconductor layer which is recrystallized selectively only at the device regions. As a result, it is necessary, when using prior art methods, to attempt to provide relatively large regions which are free of grain boundaries in order to afford some degree of freedom in the layout or arrangement of the devices. This introduces both difficulties in the fabrication and poor yield of the semiconductor integrated circuits which are fabricated using the prior art SOI technology. On the other hand, in accordance with the present invention and as explained in the foregoing, a polycrystalline silicon semiconductor layer may be recrystallized to single crystalline form in any arbitrary arrangement of preselected areas corresponding to eventual device regions. As a result, a large number of small semiconductor regions, each of which may accommodate at least the active region of a given device, for example, the channel region of an IG-FET, selectively is made free of grain boundaries in the desired device layout. Accordingly, the components, such as IG-FET's, of a semiconductor integrated circuit fabricated utilize SOI technology in accordance with the method of the invention may be free from the prior art problems arising out of the presence of grain boundaries and therefore achieve superior characteristics as well as greater fabrication yields of the integrated circuits. Moreover, the entire region required for a given device, such as not only the channel but as well the source and drain regions of an IG-FET, for example, may be fabricated in a region which is free of grain boundaries when formed in accordance with the present invention, since the single crystalline region which may be formed in accordance with the invention may be as large as 10×20 square microns.

FIGS. 5(a) through 5(d) comprise elevational, cross-sectional views of a succession of steps in the fabrication of a semiconductor device in accordance with another embodiment of the present invention.

Figure 5A:
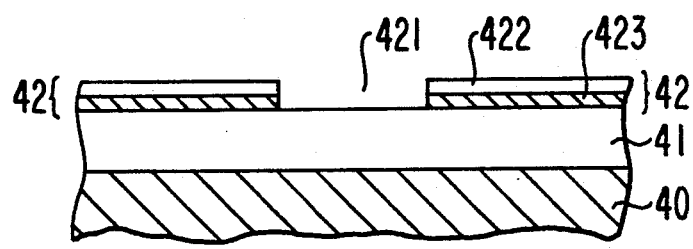
FIGS. 5(a) to 5(d) comprise schematic, cross-sectional elevational views during successive stages of the fabrication of a semiconductor device in accordance with yet another embodiment of the fabrication method of the present invention.

As shown in FIG. 5(a), an insulating layer 40 having a thickness of about one micron has formed thereon a polycrystalline semiconductor layer 41, for example a polysilicon layer, in a thickness of about 4,000 Å. An anti-reflecting film 42 which may comprise a double-layer laminate of a $Si_3N_4$ layer 422 and and underlying $SiO_2$ layer 423, each of a thickness of about 300 Å, then is formed on the polysilicon layer 41. A window 421 then is formed so as to extend through the anti-reflecting film 42 and expose a selected portion of the surface of the polysilicon layer 41. The polysilicon layer 41 then is irradiated by a laser beam thereby to be recrystallized to a single crystal form, free of grain boundaries, in the area exposed at the window 421, as in the previous embodiments.

Figure 5B:
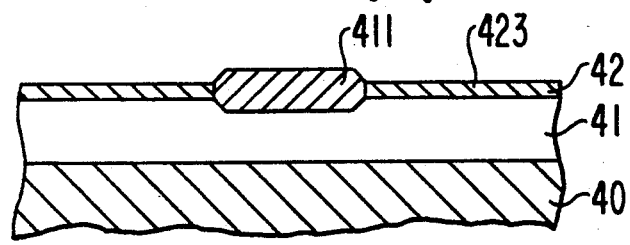
Figure 5C:
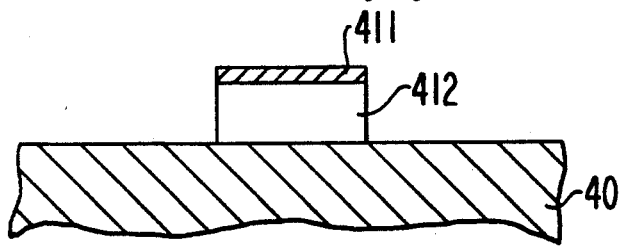
Figure 5D:
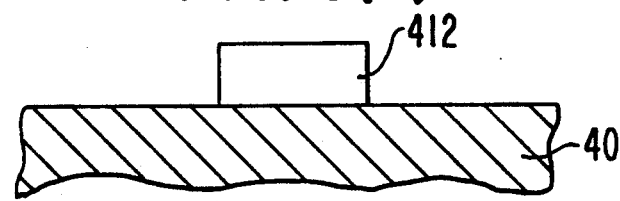

As shown in FIG. 5(b), the surface of the polysilicon layer 41 exposed at the window 421 then is thermally oxidized to form a $SiO_2$ layer 411 having a thickness of about 1,000 Å. The anti-reflecting film 42 protects the polysilicon layer 41 in the portions surrounding the periphery of the window 421 during the thermal oxidation step. The $Si_3N_4$ layer 422 of the dual layer, anti-reflecting film 42, then is removed by using a selective etchant, such as a hot phosphoric acid solution. The $SiO_2$ layer 411 and the exposed $SiO_2$ layer 423, as shown in FIG. 5(b), then are subjected to a dry etching process using a suitable etchant, such as CF$_4$ plasma. With such an etchant, the time required for etching off the 300 Å SiO$_2$ layer 423 is about 40 seconds and that for the 1,000 Å SiO$_2$ layer 411 is about 120 seconds. Hence, the surface of the polysilicon layer 41 bordering the window 421 is first exposed to the CF$_4$ plasma and subsequently is etched off completely before the remaining portion of the SiO$_2$ layer 411, of about 700 Å thickness, as shown in FIG. 5(c), is etched off, because the etch rate of silicon by CF$_4$ plasma is about 100 times larger than that of SiO$_2$. The dry etching process is continued until the SiO$_2$ layer 411 is fully removed, yielding a single crystal island 412 of silicon on the insulating layer 40, as shown in FIG. 5(d). Thus, self-aligned single crystal silicon islands may be formed through use of the SOI technology method of the present invention.

While the embodiments of the invention herein set forth represent preferred forms of practice of the method of the present invention and as well resulting structures which may be fabricated thereby, numerous modifications and adaptations will occur to those of skill in the art. Thus, it is intended by the appended claims to encompass all such modifications and adaptations as fall within the true spirit and scope of the present invention.

I claim:

1. A semiconductor fabrication method comprising the steps of:
   (a) forming a semiconductor layer of a material selected from the class consisting of amorphous and polycrystalline semiconductor materials, on an amorphous insulating layer;
   (b) forming a film on the semiconductor layer which is anti-reflecting to an impinging energy beam by forming a dual laminate film having a lower layer of silicon dioxide disposed on the semiconductor layer and an upper layer of silicon nitride disposed on the silicon dioxide layer;
   (c) selectively forming windows at respective, predetermined portions of the anti-reflecting film for exposing therethrough the surface areas of respective corresponding regions to be recrystallized to single crystalline form, free of grain boundaries;
   (d) irradiating the surface of the anti-reflecting film at least in an area including one of the windows, with an energy beam having an energy level, and for a time, sufficient to recrystallize the respective corresponding region of the semiconductor layer exposed through the irradiated window to a single crystalline condition, free of grain boundaries;
   (e) forming an oxide layer on the recrystallized region exposed by the window and thermally oxidizing the semiconductor layer exposed through the window to form a silicon dioxide layer on the exposed surface area of the single crystal region so as to be substantially thicker than the silicon dioxide layer of the anti-reflective dual laminate film;
   (f) selectively removing the anti-reflecting film from remaining portions of the semiconductor layer while retaining the oxide film on the recrystallized regions thereof and removing the silicon nitride layer by a selective etchant and removing the silicon dioxide layer of the anti-reflective film by dry etching for a sufficient time to expose the surface of the semiconductor layer surrounding the single crystal region thereof;
   (g) removing, by dry etching, the semiconductor layer from areas surrounding the recrystallized region; and
   (h) removing, by dry etching, the oxide layer from the recrystallized region to provide a self-aligned single crystal silicon island on the amorphous insulating layer.

2. A method as recited in claim 1, wherein said step (g) of dry etching is performed using a plasma of CF$_4$.

* * * * *